United States Patent [19]

Zyetz

[11] 3,765,082

[45] Oct. 16, 1973

[54] METHOD OF MAKING AN INDUCTOR CHIP

[75] Inventor: M. Charles Zyetz, Los Angeles, Calif.

[73] Assignee: San Fernando Electric Manufacturing Co., Inc., San Fernando, Calif.

[22] Filed: Sept. 20, 1972

[21] Appl. No.: 290,729

[52] U.S. Cl......................... 29/602, 29/625, 336/83, 336/200, 336/233

[51] Int. Cl................................................ H01f 7/06

[58] Field of Search....................... 29/602, 604, 625; 336/200, 233, 83

[56] References Cited

UNITED STATES PATENTS

| | | | |
|---|---|---|---|
| 3,518,756 | 7/1970 | Bennett et al. | 29/625 |
| 3,423,517 | 1/1969 | Arrhenius | 29/604 UX |
| 3,534,471 | 10/1970 | Babbitt et al. | 29/604 |
| 3,561,110 | 2/1971 | Feulner et al. | 29/602 |
| 3,683,494 | 8/1972 | Fritz et al. | 29/625 X |
| 3,629,939 | 12/1971 | Baer | 29/604 |
| 3,492,665 | 1/1970 | Stoehr | 29/604 X |

FOREIGN PATENTS OR APPLICATIONS

| | | | |
|---|---|---|---|
| 772,528 | 4/1957 | Great Britain | 336/200 |

*Primary Examiner*—Charles W. Lanham
*Assistant Examiner*—Carl E. Hall
*Attorney*—Pastoriza & Kelly

[57] ABSTRACT

A monolithic inductor chip for use in electronic circuits, especially integrated and/or hybrid microelectronic circuits, is formed by providing a plurality of ferrite wafers each having a conductive element of generally U shape silk screened on its top surface. An end portion of each element passes through a hole in the wafer to a point on the bottom of the wafer. The various wafers are stacked in such a manner that the end portion on the bottom of one wafer electrically connects to the initial point of the U shape element on the top of the next successive wafer so that the stacked wafers define an inductive coil. The resulting stack is sintered to provide the monolithic chip.

5 Claims, 6 Drawing Figures

METHOD OF MAKING AN INDUCTOR CHIP

This invention relates broadly to electrical components and more particularly to an improved inductor and method of providing the inductor in the form of a monolithic chip for use in electronic circuits, in particular for micro-electronic circuits.

BACKGROUND OF THE INVENTION

During the development phases of thick and thin film circuitry in the formation of integrated circuits and the like, it has been necessary for design engineers to modify or redesign their existing circuitry to exclude the use of the inductor. In cordwood or printed circuit board concepts, their are many types of inductors that would fill the requirements of the various circuit functions. However, little success has been achieved by building a micro-miniature inductor by a thick or thin-film process. Such inductors that could be deposited by vacuum deposition or screening were limited to extremely low value devices, useful only at microwave frequencies and generally exhibiting poor properties.

As a result of the foregoing, circuits were capacitor-coupled rather than inductor-coupled, and a number of other techniques were devised to overcome the inductor dependency of the circuit functions. Attempts have been made to solve the problem by providing bobbin-wound and core-wound inductors but even the smallest of these are large by comparison with, for example, the monolithic chip ceramic capacitor. Further, due to the extremely fine wire used and the internal connections required in such bobbin and core-wound inductors, they are inherently unreliable. As a consequence, the industry has had to be content with minimizing the use of inductors in circuit design or compromising the desirable features of complete miniaturization by utilizing such inductors as have been available.

BRIEF DESCRIPTION OF THE PRESENT INVENTION

The present invention has to do with the production of a monolithic inductor chip compatible for use with other component chips in integrated and hybrid micro-circuitry all to the end that inductors may now be used in such circuitry and still meet the various parameters desired. These parameters are listed as follows:

Inductive Range: 0.01 to 100.0 micro-henries
Frequency Range: 0.01 to 100 megahertz
Series Resistance: 0.1 – 5 ohms
Q Factor: Greater than 20
Temperature Coefficient of L: 100–500 ppm/°C
Power Rating: 0.3 watts
Rated Current: 1 amphere
Stray Capacitance: 1 pico farad
Physical Size: 0.075 inch × 0.075 inch × 0.025 inch minimum It should be understood however, that this monolithic chip inductor may also be used in non-miniature circuit fabrication.

Briefly, the monolithic inductor chip of the present invention is formed by providing a plurality of ferrite ceramic wafers each of which might be, for example, 0.0015 inch thick. A small hole is drilled through each wafer adjacent to a peripheral edge portion of the wafer. Thereafter, a conductive element of general U shape is imprinted on the top surface of each wafer such as by a silk screening process. An end portion of one leg of the U of the element passes through the hole in the wafer to a bottom point on the wafer. The various wafers may then be oriented and stacked in such a manner that the end portion on the bottom point of the element on one wafer engages and electrically connects to the initial point of the other leg of the U of the element on the top of the next successive wafer so that the imprinted elements on the various wafers when stacked define a coil. This resulting stack is then sintered to provide the monolithic chip.

The process further includes the provision of blank ferrite wafers on the top and bottom of the stack and the provision of suitable electrical leads extending from the stack and connecting to opposite ends of the defined coil.

In further embodiments of the invention, the individual wafers may include an additional printed element and cooperating hole for connection to the additional element on the next successive wafer in such a manner that a multiple coil inductor chip results. A double coil inductor chip may be utilized as a transformer by bringing out electrical leads from the first mentioned coil and the additional coil resulting from the additional elements.

BRIEF DESCRIPTION OF THE DRAWINGS

A better understanding of the invention will be had by now referring to the accompanying drawings in which.

DETAILED DESCRIPTION OF THE INVENTION

Figure 1:
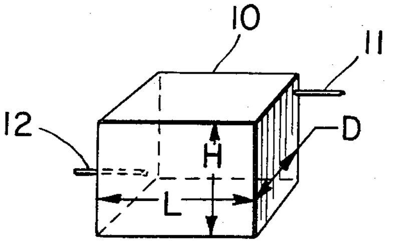
FIG. 1 is a perspective view, greatly exaggerated in size, of a single coil inductor chip in accord with the present invention.

Referring first to FIG. 1, there is shown at 10 the monolithic inductor chip of the present invention. Input and output electrical leads 11 and 12 extend from the chip 10 as shown and, as will become clearer as the description proceeds, connect to opposite ends of a defined inductance coil formed in the chip.

In the particular example of FIG. 1, the chip 10 is block shaped having length L, thickness D, and height H dimensions. As a specific example, L may be 0.075 inch, D may be 0.075 inch, and H may be 0.050 inch. It will thus be appreciated that the actual block is of a size corresponding to a grain of sand.

Figure 2:
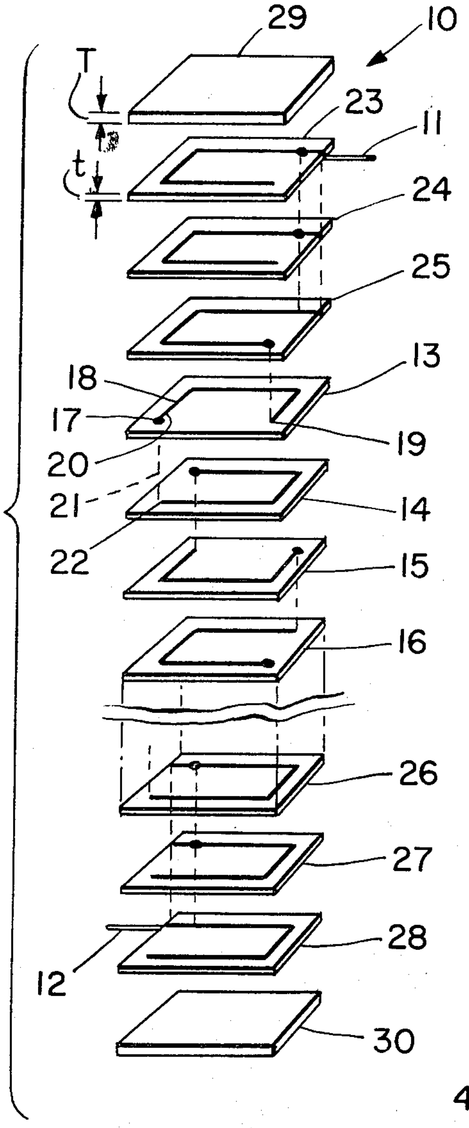
FIG. 2 is an exploded perspective view of various wafers useful in explaining the method of making up the chip of FIG. 1.

Referring to FIG. 2, the manner in which the chip of FIG. 1 is formed will be described.

Referring to the central portion of FIG. 2 there is shown a plurality of thin ferrite wafers 13, 14, 15 and 16. The wafer may be in the form of a ceramic comprised of various ferrite compositions such as NiO, ZnO, CoO, and $Fe_2O_3$.

Each of the wafers has a small hole such as indicated at 17 for the wafer 13 drilled at a point close to a marginal edge. A laser drill may be used for this purpose. A conductive element 18 is then imprinted as by silk-screening on the top surface of each wafer. In the embodiment illustrated, this conductive element is of general U shape following a path adjacent to the marginal edges of the wafer except for the open portion of the U. The conductive path or imprinted element has initial end points as indicated at 19 and 20 for the particular wafer 13. The end portion 20 of the element terminates at the hole 17.

The individual holes in each of the wafers, themselves, are filled with conductive material so that the conductive path effectively passes through the hole to a point on the bottom of the wafer.

It will now be appreciated that the individual wafers may be oriented and stacked in such a manner that the point on the bottom of one wafer marking the termination of the conductive circuit for that wafer engages the initial end of the conductive element on the top surface of the next successive wafer. This orientation is accomplished by effectively having the open U portions of the elements oriented at 90° with respect to the immediately preceeding surface.

Thus with specific reference to the wafers 13, 14, 15 and 16 it will be evident that when these are stacked, the initial end 19 of the U shaped element 18 on the wafer 13 will be engaged and electrically connected to the end of the U shaped element on the immediately preceeding wafer 25. Also, the end of the U shaped element 18 on the wafer 13 will connect through the hole 17 to the initial end of the next successive element on the successive wafer 14. This electrical connection is indicated by the dashed line 21 to the initial end 22 of the circuit on wafer 14.

It will be evident that stacking of the wafers 13 through 16 in the manner described will result in a defined coil, the current path moving in a counterclockwise direction when viewed from the top.

As indicated by the break lines in FIG. 2, there are actually many more wafers provided than shown. However, the additional wafers following the wafer 16 simply constitute a repeat of the orientations of the wafers 13 through 16.

In the preferred embodiment, the opposite ends of the stacks include termination wafers. Thus, referring to the upper portion of FIG. 2 there are included three termination wafers 23, 24 and 25 all having imprinted U shaped elements oriented in the same direction. However, a leg of each of the U shaped elements extends over the edge as well as through special holes provided in the first two wafers 23 and 24 so that in effect a redundant connection is made to the terminal lead 11 when the wafers are all together.

A similar set of termination wafers 26, 27 and 28 are provided at the lower end of the stack with extended leg portions passing over the edge of the wafers to connect redundantly to the other electrical lead 12.

While U shaped elements are shown imprinted on the termination wafers, such is not necessary but only results as a matter of expediancy in that only a single silk screen need be used in the formation of all of the termination wafers.

The assembly is completed by top and bottom blank ceramic wafers 29 and 30. Each of these blank wafers is substantially thicker than the intervening wafers as indicated by the dimension T as compared to the smaller thickness dimension $t$ for the wafer 24. Typically, T may be about 12 mils and the dimension $t$ about 1.5 mils. In the embodiment illustrated, there would be a total of 19 intermediate wafers between the blank wafers 29 and 30.

With the wafers arranged as described, the resulting stack is sintered to provide the monolithic chip illustrated in FIG. 1.

It will, of course, be understood by those skilled in the art that a large number of monolithic chips would ordinarily be fabricated simultaneously by providing large area sheets of the wafers with many of the circuits simply repeated in a pattern on each sheet all of the sheets then being stacked together and ultimately cut along suitable lines to provide the individual chips.

The specific chip described in FIGS. 1 and 2 has an inductance of about 5 micro-henries. A larger inductance may be provided by providing more intermediate layers, larger chips, or a double coiled chip such as will now be described in conjunction with FIGS. 3 and 4.

Figure 3:
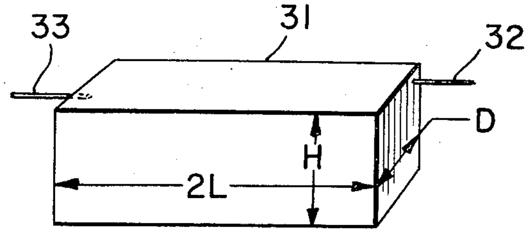
FIG. 3 is a perspective view of a monolithic inductor chip incorporating a double coil circuit in accord with the present invention.

Referring to FIG. 3, the double coiled chip is shown at 31 with input and output electrical leads 32 and 33. Essentially, the chip 31 constitutes two defined coils formed as described in FIGS. 1 and 2 in side by side relationship resulting in a length dimension of 2L; that is, approximately twice the length of the chip of FIG. 1. Thus, typical dimensions for the chip of FIG. 3 might be 0.150 inch × 0.075 inch × 0.050 inch.

Figure 4:
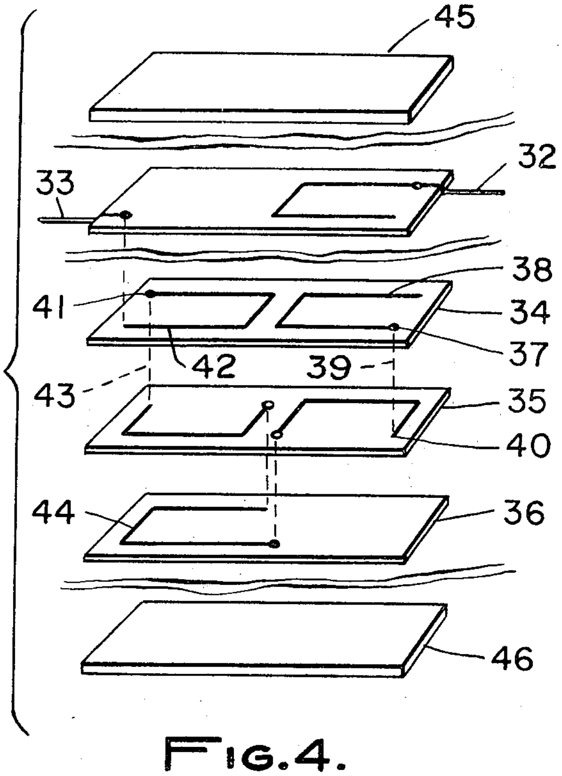
FIG. 4 is an exploded perspective view showing some of the wafers useful in explaining the formation of the chip of FIG. 3.

The chip 31 of FIG. 3 is made up similarly to that of FIG. 1 as will now be evident by referring to FIG. 4. In FIG. 4 there is shown in the central portion a plurality of wafers 34, 35 and 36. Each of these wafers is provided with a hole such as at 37 and U shaped silk screened conductive paths or elements 38. Electrical connections between successive elements on successive wafers when stacked are effected through the holes as indicated at 39 to the initial end of the next successive element 40.

Each wafer, however, also includes an additional hole drilled therethrough as indicated at 41 for the wafer 34 and an additional U shaped element 42 silk screened thereon in side by side relationship with the first mentioned element. The additional elements are oriented such that electrical connections can be made through the additional holes as indicated at 43 to the successive elements on successive wafers when stacked.

In the embodiment of FIG. 4, the wafer 36 towards the bottom of the stack has its additional element 44 connected directly to its side by side element so that the additional elements define an additional coil which effectively constitutes a continuation of the first defined coil.

Blank ferrite end wafers 45 and 46 are added to the stack and the assembly then sintered to provide the block shown in FIG. 3.

Figure 5:
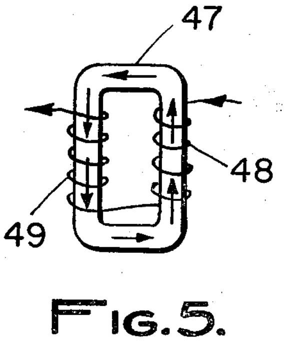
FIG. 5 shows the equivalent inductor circuit defined by the inductor chip of FIGS. 3 and 4.

FIG. 5 shows the equivalent electrical element for the structure of FIGS. 3 and 4 wherein it will be noted that the effective core 47 carries flux in a closed path, the current direction in the defined equivalent coils 48 and 49 being as indicated by the arrows at the inlet and outlet leads.

Figure 6:
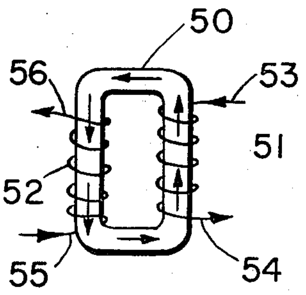
FIG. 6 shows an equivalent circuit when utilizing the double coil chip as a transformer.

FIG. 6 illustrates how the structure of FIGS. 3 and 4 may be slightly modified to provide a monolithic transformer. Thus, there is shown a flux carrier core 50 with the defined coil 51 and additional defined coil 52.

However, rather than connecting the coil 52 as a continuation of the coil 51, separate leads 53, 54, 55 and 56 connect to opposite ends of the coils so that one coil functions as a primary and the second coil functions as a secondary for the transformer.

The double coiled inductor chip described in FIGS. 3 and 4, the equivalent element of which is shown in FIG. 5, provides a substantially higher inductance than would result by simply adding the inductances of two single coiled chips as described in FIG. 1. This higher inductance results from the fact that for a closed magnetic path, the inductance is a function of the number of turns squared and thus by doubling the number of turns in a single monolithic structure as described in FIGS. 3 and 4, the inductance is approximately four times that of the single coiled inductor chip described in FIGS. 1 and 2.

It should be noted that the blank ferrite wafers 29 and 30 in FIG. 2 and 45 and 46 in FIG. 4 are of sufficient thickness T and the margins of each wafer from the U shaped element to the edges of sufficient width to provide a magnetic path which closes the magnetic circuit of cross-sectional area equal to or greater than the area within the U shaped elements thereby providing a non-restrictive closed magnetic path to maximize magnetic coupling between turns of the coil and thereby provide the effect of maximizing the inductance obtainable in a solid chip.

From the foregoing description, it will be evident that the present invention has enabled the provision of inductor chips for the first time which may be used in integrated and hybrid micro-electronic circuitry. Various modifications in the actual imprinting of the circuit falling clearly within the scope and spirit of this invention will occur to those skilled in the art. The overall invention, accordingly, is not to be thought of as limited to the specific monolithic inductor chips shown and described by way of example.

What is claimed is:

1. A method of providing a monolithic inductor chip including the steps of:

*a.* providing a plurality of ferrite wafers dimensioned to be stacked, one on top of the other, with their peripheries approximately in registering relationship;

*b.* drilling a small hole through each wafer adjacent to a peripheral edge portion;

*c.* imprinting a conductive element of general U shape having initial and end points on a top surface of each wafer, the end point of the U terminating at said hole;

d. filling the hole in each wafer with conductive material;

*e.* orienting the wafers in a stack such that the open portion of the U shape on each successive wafer is oriented at 90° to the U shape on its preceeding wafer whereby the hole at the end point is in vertical alignment with the initial point of the succeeding U shape on the succeeding wafer so that a conductive connection between the one element and other is effected through the hole thereby electrically connecting the U shaped elements on successive wafers to define a coil; and,

*f.* sintering the resulting stack to thereby provide said monolithic inductor chip.

2. The method of claim 1, including the steps of providing blank ferrite wafers of greater thickness than the wafers making up said plurality, on the top and bottom of the stack prior to sintering and providing electrical leads extending from the stack connecting to opposite ends of the defined coil thereby providing an inductor chip for ready connection in integrated or hybrid mocro-electronic circuits.

3. The method of claim 1, including the steps of drilling an additional hole in each wafer; providing an additional U shaped element imprinted on each wafer in side by side relationship with the first mentioned U shaped element, the terminal end point of the additional elements terminating at the additional hole and filling the additional hole with conductive material; orienting and connecting the additional elements such as to provide a continuation of the coil defined by the first mentioned elements to thereby provide multiple coiled inductor chip configuration of increased inductance relative to that of the first mentioned defined coil.

4. The method of claim 1, including the steps of drilling an additional hole in each wafer; providing an additional U shaped element imprinted on each wafer in side by side relationship with the first metnioned U shaped element, the terminal end point of the addtional element terminating at the additional hole and filling the additional hole with conductive material; orienting and connecting the additional elements to define an additional coil; and providing electrical leads extending from the stack connected to opposite ends of the first mentioned defined coil and additional coil to thereby provide a transformer.

5. The method of claim 2, including the steps of providing blank ferrite wafers with sufficient thicknesses and the margins of each of the plurality of wafers from the U shaped element to the edges of sufficient width to provide a magnetic path which closes the magnetic circuit of cross-sectional area equal to or greater than the area within the U shaped elements thereby providing a non-restrictive closed magnetic path to maximize magnetic coupling between turns of the coil and thereby provide the effect of maximizing the inductance obtainable in a solid chip.

* * * * *